United States Patent [19]
Larson

[11] 3,889,186
[45] June 10, 1975

[54] ALL DIGITAL PHASE DETECTOR AND CORRECTOR

[75] Inventor: Robin J. Larson, Norcross, Ga.

[73] Assignee: The United States of America as represented by the Secretary of the Army, Washington, D.C.

[22] Filed: Nov. 27, 1973

[21] Appl. No.: 419,329

[52] U.S. Cl. ............................... 324/83 D; 328/155
[51] Int. Cl.² .................... G01R 25/00; H03D 13/00
[58] Field of Search ............. 324/83 D, 82; 328/155

[56] References Cited

UNITED STATES PATENTS

| | | | |
|---|---|---|---|
| 3,271,688 | 9/1966 | Gschwind et al. | 328/155 X |
| 3,544,907 | 12/1970 | Bleickardt | 328/155 X |
| 3,781,695 | 12/1973 | Jackson | 328/155 |

*Primary Examiner*—Robert J. Corcoran
*Assistant Examiner*—Rolf Hille
*Attorney, Agent, or Firm*—John R. Utermohle; Thomas O. Maser

[57] ABSTRACT

An improved apparatus for detecting and correcting phase errors using all digital means. Transitions from a pseudo-random digital input pulse train cause a digital sample-and-hold device to store a value representing a magnitude and direction of phase error between the input pulse train and an output pulse train. This error value controls a digital pulse source whose output frequency is proportional to the error value. An up/down counter, which is incrementing at a controlled rate many times faster than the frequency of the input pulse train, is caused to increase or decrease its incrementing rate at a rate determined by the pulse source output, and in a direction determined by the direction of the phase error. A gating circuit transforms the counter contents into a value which, when sampled at the instant of transition of the input pulse train, provides a value indicative of phase error magnitude and direction to the inputs of the sample-and-hold device. The output of the highest order stage of the counter is a square wave whose phase error is continually being detected and corrected in conformity with the phase of the input pulse train.

6 Claims, 2 Drawing Figures

ALL DIGITAL PHASE DETECTOR AND CORRECTOR

BACKGROUND OF THE INVENTION a. Field of the Invention

This invention relates generally to the field of error correction and detection, and more specifically to creating a square wave clock signal whose phase is the same as that of a pseudo-random input pulse train.

b. Description of the Prior Art

In electronic receiving apparatus, it is commonly necessary to create, from a pseudo-random incoming digital signal, a timing clock pulse train which is in phase with the incoming transmitted signal. This has in the past been done by either analog or digital techniques, or by a combination of the two.

The known analog techniques have the advantage of easily controlled operating parameters which may be reset for each new application; however, they have the serious disadvantage of being difficult to preset to a desired frequency. The digital techniques known to the prior art are more easily preset to a desired frequency, but in so doing additional problems are created. Specifically, the known digital error detectors and correctors have operating parameters which are difficult to control and which are highly sensitive to input frequency changes and duty cycles.

It is, therefore, desirable to provide an all-digital device which offers operating parameters that are easily controlled, which allows preset capability and operating parameters that are insensitive to the input frequency, and which has operating parameters having reduced sensitivity to the input duty cycle.

BRIEF SUMMARY OF THE INVENTION

It is an object of this invention to provide a new and improved all digital phase detector and corrector.

It is a further object of this invention to provide an all digital phase detector and corrector which is insensitive to changes in input frequency and which has reduced sensitivity to the input duty cycle.

It is also an object of this invention to provide an all digital phase detector and corrector with easily controllable operating parameters.

It is a further object of this invention to correct phase error at a rate which is proportional to the magnitude of phase error.

With these and other objects in view, an all-digital phase detector and corrector embodying the invention may include a counter, a frequency source which increments the counter, a source of input pulses, and a phase detector which first detects the magnitude and direction of phase error between the input pulses and the square wave, and then provides pulses to the input of the counter at a rate proportional to the magnitude of phase error to increase or decrease the counter stepping rate, thereby reducing the phase error.

More specifically, in one embodiment of the present invention, an all digital phase detector circuit embodying the invention includes a sample-and-hold circuit which is capable of storing a value when triggered by transitions from an input data train. A counter is caused to increment at a rate equal to many times the input data rate. The outputs from the stages of the counter feed a series of "exclusive or" gates which convert the counter value into a value indicative of the magnitude and direction of the phase error when stored by the sample-and-hold circuit at the instant of transition of the input pulse. a rate multiplier having a plurality of inputs from the sample-and-hold circuit provides a pulse train at a rate proportional to the phase-error magnitude. The pulse train causes the counter to step up or down in accordance with whether the output phase lags or leads that of the input, and at a rate proportional to the phase error magnitude.

Other objects and advantages of the present invention will be apparent from the following detailed description, when considered in conjunction with the accompanying drawings wherein:

DESCRIPTION OF THE PREFERRED EMBODIMENT

Figure 1:
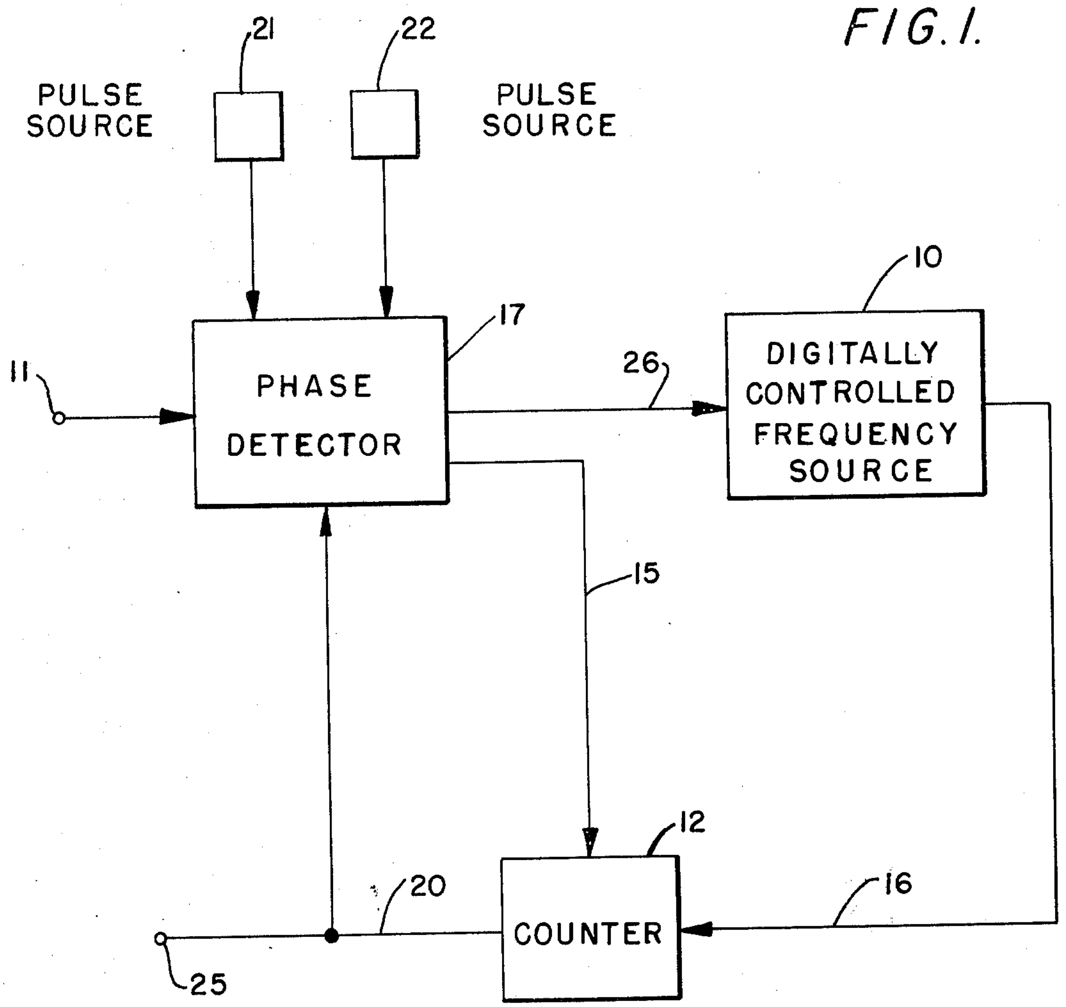
FIG. 1 is a block diagram of a second order phase lock loop embodying the invention.

Referring to FIG. 1, the circuit to be described may be seen to be a second order phase lock loop. Only the operation of a second order loop is described herein, but it is to be understood that only minor variations, for example, adding circuitry identical to the phase detector and corrector with the sample-and-hold circuit replaced by an up/down binary counter, would be needed to convert the second order loop into higher order phase lock loops for special applications. A digitally controlled frequency source 10 provides at its output a pulse train which has some frequency many times the frequency of a pulse train applied to the data input terminal 11. When the circuit is phase locked, the output frequency of the source 10 will be $2^N$ times the frequency of the data applied at terminal 11, with N being the number of stages in a binary counter 12. The up/down binary counter 12 accepts as inputs the signals on lines 15 and 16. The signal on line 16 causes the counter 12 to increment at a rate controlled by the frequency source 10, and the signal on line 15 alters that basic incrementing rate up or down, with the direction and rate controlled by a phase detector 17. The counter output, applied to a line 20, is actually a number of outputs, one from each stage of the counter 12. The output of the highest order stage is a square wave pulse train, the frequency and phase of which is substantially identical to the data applied to the input terminal 11. The stage outputs of the counter 12 are fed into the phase detector 17, together with the outputs from pulse sources 21 and 22, and the data input at terminal 11 in conformance with which phase the circuit output, at terminal 25, is to be corrected. The data on lines 15 and 26 of the phase detector 17 are pulse trains, each of whose frequency is a fraction of the frequency of its corresponding pulse source 21 or 22, that fraction being determined by the measured phase error. The correction pulses on line 15 are used to correct the detected phase error, and the pulses on line 26 correct any detected frequency error, if such correction is necessary.

Figure 2:
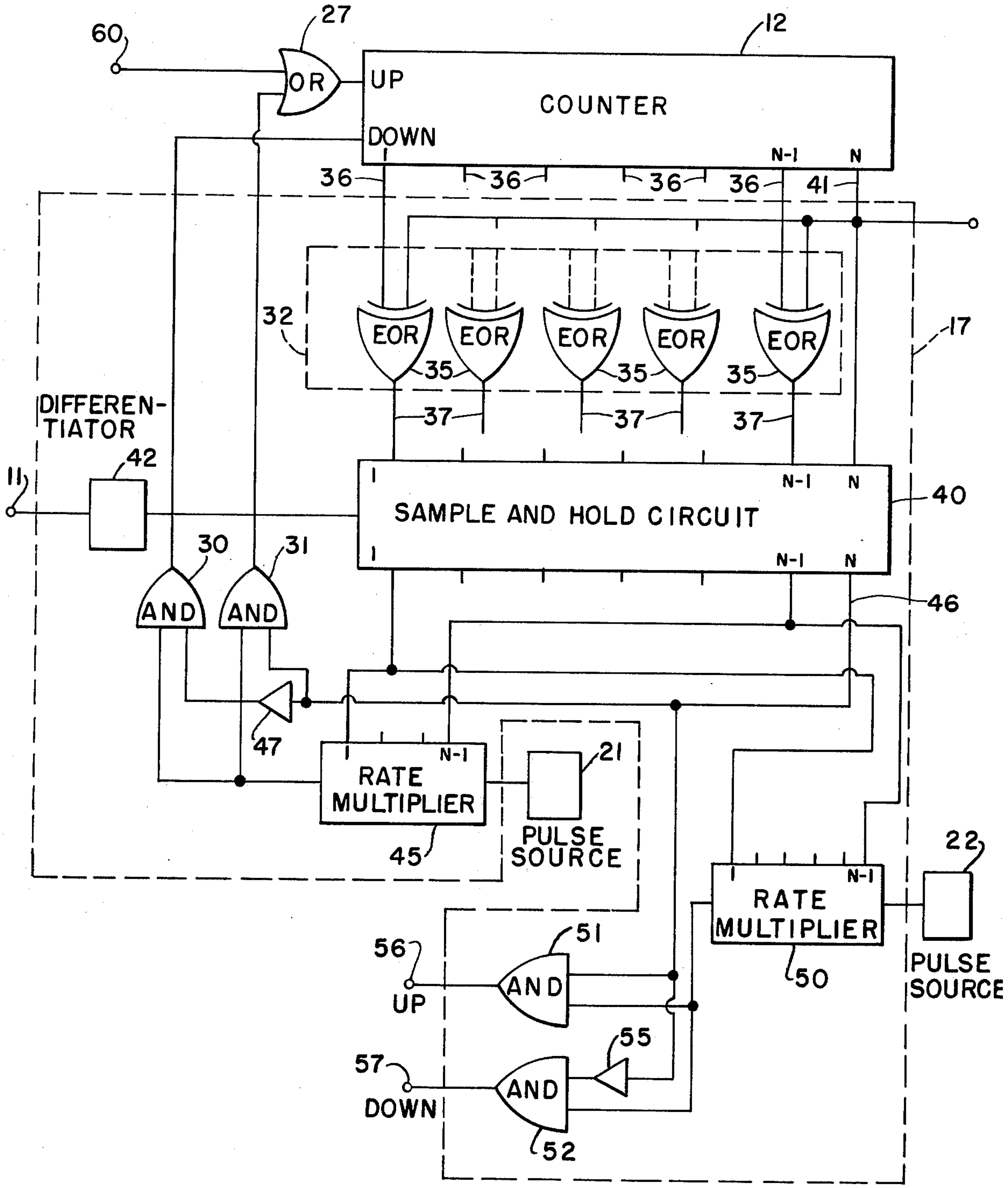
FIG. 2 is a more detailed block diagram of certain portions of FIG. 1.

FIG. 2 shows, in greater detail, the pulse sources 21 and 22, the phase detector 17, and the counter 12 of FIG. 1. In this embodiment, an 8-stage binary counter will be used for purposes of illustration, but counters of larger or smaller size could be easily adapted to the circuit. The counter 12 has two inputs; an "UP" input fed from an "OR" gate 27, and a "DOWN" input fed from an "AND" gate 30. A circuit 32 composed of seven "Exculsive OR" gates 35—35 (in general the number of "Exclusive OR" gates would equal the number of counter stages minus one) is connected to the counter 12 such that each of the seven lowest order outputs (1 thru N-1) of the counter is connected by a line 36—36 to an input of one "Exclusive OR." The output of each "Exclusive OR" is connected by a line 37—37 to an input of an 8-bit sample-and-hold circuit 40 in the following manner: the output of the lowest order stage of the counter is connected through an "Exclusive OR" to the first stage of the sample-and-hold circuit 40, the next lowest output of the counter is connected through an "Exclusive OR" to the second stage of the sample-and-hold circuit, and so on with the output of the seventh lowest order stage of the counter (N-1) connected through an "Exclusive OR" to the seventh stage (N-1) of the sample-and-hold circuit. The output of the highest order stage (N) of the counter is connected by a line 41 to the second input of each of the "Exclusive OR" gates in the circuit 32, and additionally is connected directly to the eighth stage (N) of the sample-and-hold circuit 40. The activiating input for the sample-and-hold circuit is connected from a differentiator 42. The first seven outputs (1 thru N-1) from the sample-and-hold circuit are connected to a 7-bit binary rate multiplier 45 such that the output rate of the rate multiplier is proportional to the size of the binary number stored within the first seven stages (1 thru N-1) of the sample-and-hold circuit 40. A pulse source 21 is connected to the input of the rate multiplier 45, and the output of the rate multiplier is connected to one input of each of two "AND" gates 30 and 31. The eighth output (N) 46 of accomplished. The output from the frequency source 10 of FIG. 1 is connected at terminal 60 to the second input of "OR" gate 27. With this design, wide discretion is given the designer in choosing the loop parameters. For example, by choosing the frequency of the pulse source 21, which controls the loop damping factor, to be equal to the frequency of the pulse source 22, which controls the loop natural frequency, it is possible to eliminate one rate multiplier with its accompanying pulse source, inverter, and "AND" gate pair from the circuit of FIG. 2.

Having defined the components shown in FIGS. 1 and 2, the operation of the circuit may be explained. When the circuit is phase-locked to data incoming at terminal 11, the frequency source 10 is generating a sufficient number of pulses to cause the binary counter 12 to increment from 0 to 255 ($2^8$ steps) as the data input pulse train applied at terminal 11 goes through one complete frequency cycle.

By defining some transition of the input data (either 1 to 0 or 0 to 1) to have zero phase, and observing the value in the counter 12 at that point of each cycle, the deviation of the counter value from 0 may be defined to be the magnitude of phase error. However, since this digital count represents positive phase only from 0° to 360°, the count could not properly operate in a phase lock loop type of corrector. That is, with a 0° to 360° representation, phase errors would always be positive with various magnitudes, and the phase lock loop would always correct itself in the same direction, never stabilizing. Hence, the loop could not achieve a phase lock. It is, therefore, necessary to convert the digital count to a −180° to +180° representation. This is achieved by the "Exclusive OR" circuit 32.

| Counter Sequence Phase error 0 to 360° | | | | | | | | | Modified Count Sequence Phase error −180° to +180° | | | | | | | | |
|---|---|---|---|---|---|---|---|---|---|---|---|---|---|---|---|---|---|
| | Bit 8 | | | | | | | Bit 1 | | Bit 8 | | | | | | | Bit 1 |
| 355.8° | 1 | 1 | 1 | 1 | 1 | 1 | 0 | 1 | −2.8° | 1 | 0 | 0 | 0 | 0 | 0 | 1 | 0 |
| 357.2° | 1 | 1 | 1 | 1 | 1 | 1 | 1 | 0 | −1.4° | 1 | 0 | 0 | 0 | 0 | 0 | 0 | 1 |
| 358.6° | 1 | 1 | 1 | 1 | 1 | 1 | 1 | 1 | −0° | 1 | 0 | 0 | 0 | 0 | 0 | 0 | 0 |
| 0° | 0 | 0 | 0 | 0 | 0 | 0 | 0 | 0 | +0° | 0 | 0 | 0 | 0 | 0 | 0 | 0 | 0 |
| 1.4° | 0 | 0 | 0 | 0 | 0 | 0 | 0 | 1 | +1.4° | 0 | 0 | 0 | 0 | 0 | 0 | 0 | 1 |
| 2.8° | 0 | 0 | 0 | 0 | 0 | 0 | 1 | 0 | +2.8° | 0 | 0 | 0 | 0 | 0 | 0 | 1 | 0 |

the sample-and-hold circuit is connected directly to one input of "AND" gate 31 and to an inverter 47 whose output is connected to the second input of the "AND" gate 30. The output of the "AND" gate 31 is connected to one input of "OR" gate 27. The output of "AND" gate 30 is connected to the "DOWN" input of the counter 12. In like manner, as with the rate multiplier 45, the first 7 outputs (1 thru N-1) of the sample-and-hold circuit 40 are connected to a second 7-bit binary rate multiplier 50, with an input from pulse source 22. The output from the eighth stage of the sample-and-hold circuit 40 is connected by line 46 to one input of "AND" gate 51 and to an inverter 55 which, in turn, is connected to "AND" gate 52. The output from the rate multiplier 50 is connected to the inputs of "AND" gates 51 and 52. The outputs from "AND" gates 51 and 52 are connected at terminals 56 and 57 to the "UP" and "DOWN" inputs respectively of the digitally controlled frequency source 10 (FIG. 1) which may be designed substantially as shown in FIG. 2. With such a design, both frequency and phase correction may be The table above illustrates the counter values just preceeding and following the roll-over count, together with the accompanying modified count resulting from the "Exclusive OR" circuit. As indicated in the table, the numbers above and below roll-over in the counter sequence, i.e., all 1's to all 0's, are complements of each other. Note also that the value of the bit 8, the square wave output of the counter, is a 0 for the first half of a complete count sequence and a 1 for the second half. If bit 8 is used to invert the first 7 bits when bit 8 is a 1 as shown in the table, the modified count may be used to represent phase from −180° to +180°, with each increment representing 360° ÷ $2^8$, or 1.4°. Bit eight, the most significant bit of the counter, will indicate the direction, + or −, and bits one through seven will be a ditial representation of the phase magnitude.

To accomplish the bit-for-bit inversion with the "Exclusive OR" circuit 32, the seven lowest order outputs of the counter are applied via lines 36—36 to one input of separate "Exclusive OR" gates, and the highest order output is applied by line 41 to the other input of the gates. The "Exclusive OR" gates invert the signals on lines 36—36 when the signal on line 41 (bit 8) is a 1, and do not invert the signals on line 36—36 when the signal on line 41 (bit 8) is a 0, which gives the modified count sequence shown in the table. By defining the point of zero phase of the data incoming on terminal 11 to be the instant of transition from logic 1 to logic 0, the pulses on the inputs of the sample-and-hold circuit 40 at that instant may be interpreted as having the magnitude and direction of deviation from that zero phase point. As is easily seen from the above table, the modified count sequence allows one to treat the seven least significant bits (1 thru N-1) stored in the sample-and-hold circuit 40 as representing the magnitude of deviation of the counter from a 0° representation, with the value of the eighth (N), or most significant bit representing the direction of deviation. A 1 in the eighth bit indicates that the counter "lags" in phase by a magnitude indicated by the other seven bits; conversely, a 0 indicates that the counter "leads" by a magnitude indicated by the other seven bits. To detect this deviation, the data input pulse at 11 is fed into the differentiator 42 which provides a pulse at its output each time the data input at 11 changes from logic 1 to logic 0. The pulse causes the circuit 40 to sample and hold the values, 1 or 0, present at its inputs from the circuit 32 at that instant. These values will be held within the sample-and-hold circuit until the next transition pulse, and are continually provided at the outputs during that time. The rate multiplier 45, when connected to the sample-and-hold circuit as described hereinabove, provides at its output a pulse train whose frequency is some fraction of the frequency of the pulse source 21, that fraction being the value stored in the first seven bits (1 thru N-1) of the sample-and-hold circuit 40 divided by 128 ($2^7$). Note that the output of the rate multiplier 45, which provides the correction pulses to the up/down counter 12, has a low rate for small phase errors and a higher rate for large phase errors.

Looking again to the modified count sequence in the table, it may be seen that if the value stored in the eighth bit (N) of the sample-and-hold circuit is a logic 0, the counter value is too high and needs to be decreased. This is done by applying the 0 value from the output 46 through the inverter 47 to provide a logic 1 to the corresponding input of the "AND" gate 30. The 1 on that input allows the correction pulses on the other input to pass through "AND" gate 30 to the "DOWN" input of the counter 12, thereby decreasing the counter value, as required. Similarly, as seen in the table, if the value stored in bit 8 (N) of the sample-and-hold circuit is a logic 1, the counter value is too low and needs to be increased. The 1 on the output 46 is fed directly to "AND" gate 31, allowing pulses from the rate multiplier 45 to pass through "AND" gate 30 to one input of the "OR" gate 27. The resulting pulse train appearing at the "UP" input of counter 12 will be the sum of pulses from the frequency source on line 60 plus the correction pulses from "AND" gate 31, thereby causing counter 12 to increment faster as was required.

In summary, the phase detector and corrector described herein utilizes all-digital means to achieve its result. Detection is accomplished by comparing a modified counter sequence with a pseudo-random input pulse train at the instant the pulse train registers a 1 to 0 transition. The detected phase error is converted into a pulse train whose frequency is proportional to the magnitude of the detected phase error, and the pulse train is used to modify the counter stepping rate up or down according to the direction of the phase error.

It is to be understood that any number of modifications could be made to the preferred embodiment as described herein above, and that the inventor intends to limit his invention only as defined in the appended claims.

What I claim is:

1. An apparatus for detecting and correcting phase error comprising:

a frequency source;

a binary counter coupled to said frequency source and incrementing at a rate controlled by said frequency source;

a source of input pulses;

means coupled to said pulse source for detecting a transition in said input pulses;

means responsive to said transition-detecting means and coupled to said counter for detecting the error, at the instant of said transition, between the value in said counter and a predetermined value and for converting the value in said counter to a value representing magnitude and direction of phase error when compared with the phase of said input pulse; and means responsive to said error-detecting means and coupled to said counter for varying said counter incrementing rate at a rate proportional to said error, thereby correcting said error.

2. The apparatus of claim 1, wherein said error-detecting means includes a sample-and-hold circuit.

3. The apparatus of claim 2, where said counter-rate-varying means includes at least one binary rate multiplier coupled to said sample-and-hold circuit.

4. The apparatus of claim 3, wherein said counter-rate-varying means includes a pulse source driving said rate multiplier.

5. The apparatus of claim 4, wherein said counter-rate-varying means includes means for communicating said magnitude of phase error to said rate multiplier, whereby said rate multiplier outputs a pulse train whose frequency is proportional to said magnitude of phase error.

6. The apparatus of claim 5, wherein said counter-rate-varying means includes means for gating said pulse train from said rate multiplier to said counter, whereby the stepping rate of said counter will increase or decrease to lessen said magnitude of phase error.

* * * * *